US007732228B2

(12) United States Patent
Ono et al.

(10) Patent No.: US 7,732,228 B2
(45) Date of Patent: Jun. 8, 2010

(54) METHOD FOR MANUFACTURING PRINTING HEAD

(75) Inventors: Takayuki Ono, Kanagawa (JP); Yohei Sato, Kanagawa (JP); Satoshi Shimazu, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 902 days.

(21) Appl. No.: 11/477,352

(22) Filed: Jun. 30, 2006

(65) Prior Publication Data

US 2007/0006459 A1 Jan. 11, 2007

(30) Foreign Application Priority Data

Jul. 8, 2005 (JP) ............................ 2005-200149

(51) Int. Cl.
*H01L 21/00* (2006.01)

(52) U.S. Cl. .................. 438/21; 438/273; 257/E27.001

(58) Field of Classification Search .................. 438/21; 347/1, 8, 9, 20, 37, 55, 56, 63, 100, 214, 347/148, 10, 19, 65; 257/E27.001
See application file for complete search history.

(56) References Cited

U.S. PATENT DOCUMENTS 6,116,714 A 9/2000 Imanaka et al. ............... 347/19
6,217,157 B1 4/2001 Yoshihira et al. .............. 347/65
6,288,940 B1 9/2001 Kawamura ............. 365/185.09
6,377,358 B1 4/2002 Hayasaki et al. ........... 358/1.16
6,386,832 B1 5/2002 Taneya et al. ................. 417/52
6,406,135 B1 6/2002 Watanabe et al. ............. 347/65
6,409,296 B1 6/2002 Misumi et al. ................ 347/11
6,409,317 B1 6/2002 Shimizu et al. ............... 347/65
6,419,347 B2 7/2002 Ono et al. ..................... 347/63
6,450,776 B1 9/2002 Taneya et al. ............... 417/207
6,530,641 B2 3/2003 Ohashi et al. ................. 347/20
6,582,069 B2 6/2003 Ohashi et al. ................. 347/94
6,585,491 B2 7/2003 Taneya et al. ................. 417/52
6,616,257 B2 9/2003 Imanaka et al. ............... 347/10
6,631,966 B2 10/2003 Watanabe et al. ............. 347/18
6,637,867 B2 10/2003 Sugiyama et al. ............. 347/65
2002/0075337 A1* 6/2002 Osada et al. .................. 347/12
2003/0001936 A1* 1/2003 Hirosawa et al. .............. 347/87
2005/0078143 A1 4/2005 Shimomura et al. ........... 347/20
2006/0027937 A1* 2/2006 Benson et al. .............. 257/787

FOREIGN PATENT DOCUMENTS

JP 5-218141 8/1993

* cited by examiner

*Primary Examiner*—Alexander G Ghyka
*Assistant Examiner*—Abdulfattah Mustapha
(74) *Attorney, Agent, or Firm*—Fitzpatrick, Cella, Harper & Scinto

(57) ABSTRACT

A process for manufacturing a printing head is able to maintain an appropriate connection between a substrate and flying leads. The process includes a connecting step of connecting electric connection terminals of a substrate and flying leads provided on an electric wiring basic material and a mounting step of mounting a unit consisting of the electric wiring base material and the substrate connected together, on a printing head main body. During the connecting step, the substrate and each flying lead are electrically connected together with a predetermined distance between them. During the mounting step, the unit is fixed to the printing head main body so that the distance between each of the electric connection terminals of the substrate and the electric wiring base material is shorter than the predetermined distance. This forms a slack shape of each flying lead.

1 Claim, 9 Drawing Sheets

METHOD FOR MANUFACTURING PRINTING HEAD

BACKGROUND OF THE INVENTION

1. Field of the Invention

The present invention relates to a method for manufacturing a printing head in which a resin or metal material is used to form ink ejecting nozzles. Specifically, the present invention relates to a method for manufacturing an printing head in which when a flying lead portion of a substrate having ejection energy generating elements is electrically connected to a flexible wiring base material having a flying lead terminal portion, the substrate having the energy generating elements is connected to the electric wiring base material having the flying leads with the flying lead terminal portion slacked.

2. Description of the Related Art

A printing head used in an ink jet printing apparatus is provided with a printing element substrate from which ink droplets are ejected. The printing element substrate has a plurality of energy generating means (for example, heaters) that generate energy required to eject ink through ink ejection orifices, electric wiring such as Al which supplies power to each energy generating element; the energy generating elements and electric wiring are formed by a film forming technique. A plurality of ink channels and ejection orifices corresponding to printing elements are also formed by a photolithography technique.

The printing element substrate connects to an electric wiring base material that applies an electric signal for allowing ink to be ejected to the printing element substrate. The electric wiring base material and printing element substrate are connected together using flying leads connected to the electric wiring base material. In this case, to maintain the connection between the printing element substrate and the electric wiring base material, the flying leads need to be slacked.

The substrate having the energy generating elements and the electric wiring base material are laminated to an ink supply member or an ink supply supplementing member. The electric connection portion and flying lead portion are then fixed using a sealing material or the like. Consequently, heat resulting from these steps thermally expands the ink supply member and ink supply supplementing member to pull the laminated electric wiring base material away from the electric connection portion. At this time, if the flying leads are insufficiently slacked, the electric connection portion or flying lead portion may be loaded and disadvantageously cracked or destroyed.

Such a technique as shown in Japanese Patent Application Laid-open No. 5-218141 (1993) is known as a method for forming a slack shape in the flying lead portion. Japanese Patent Application Laid-open No. 5-218141 (1993) presses an elastomer such as silicone rubber against flying leads (inner leads) of an electric wiring base material (TAB tape) electrically connected to a substrate (semiconductor pellet). The flying lead portion is thus bent and slacked.

Another known method for forming a slack shape in the flying lead uses a male mold and a female mold to pre-form a slack shape in the flying lead portion.

However, the conventional technique presses the elastomer or the like against the flying leads electrically connected to the substrate to mechanically bend the flying leads in crank form. This may heavily load the electric connection portion and locally concentrate stress in the flying leads. In particular, if the pitch and width of the flying leads decrease with increasing density of connection terminals of the substrate, the load on the flying leads and electric connection portion further increases. This may make the flying leads or their connection portions more likely to be destroyed, for example, cracked or cut. Furthermore, if an elastomer or the like is pressed against the flying leads, it must be durable.

On the other hand, if a male mold and a female mold are used to form a slack, molding is usually difficult because of the very small size of the flying leads. Further, continuous operation reduces the lifetime of the molds, thus making reliability likely to be degraded. This requires the molds to be frequently replaced, thus disadvantageously increasing manufacturing costs.

SUMMARY OF THE INVENTION

An object of the present invention is to provide a method for manufacturing a printing head that can maintain the appropriate connection between a substrate having ejection energy generating elements and flying leads provided on an electric wiring base material even if heat generated during a manufacture process or the like thermally expands the components, the printing head being able to be inexpensively manufactured using a reduced number of manufacture steps.

To accomplish this object, the present invention is configured as described below.

A first aspect of the present invention provides a method for manufacturing a printing head, the method comprising: a connecting step of connecting deformable flying leads provided on an electric wiring base material to electric connection terminals provided on a substrate having ejection energy generating elements that receive electric energy to generate ejection energy required to eject ink; and a mounting step of mounting a unit comprising the electric wiring base material and the substrate connected together during the connecting step, on the printing head main body, wherein the connecting step electrically connects the substrate and the flying leads together with a predetermined distance between the substrate and the flying leads, and the mounting step fixes the unit comprising the substrate and electric wiring base material to the printing head main body so that a distance between the electric connection terminals of the substrate and the electric wiring base material is shorter than the predetermined distance, to form a slack shape bent along a continuous curved surface of each of the flying leads.

A second aspect of the present invention provides a method for manufacturing a printing head, the method comprising: a connecting step of connecting deformable flying leads provided on an electric wiring base material to electric connection terminals provided on a substrate having ejection energy generating elements that receive electric energy to generate ejection energy required to eject ink; and a mounting step of mounting a unit comprising the electric wiring base material and substrate connected together during the connecting step, on first and second surfaces formed on the printing head main body at different heights; wherein the connecting step positions the electric connection terminals of the substrate and the wiring substrate via a step amount larger than that which is equal to a difference in height between the first and second surfaces, and connects the flying leads to the electric connection terminals, to form a slack shape bent along a continuous curved surface of each of the flying leads coupling the electric wiring base material mounted on the first surface during the mounting step to the electric connection terminals of the substrate mounted on the second surface during the mounting step.

According to the present invention, even if heat generated during a manufacture process or the like thermally expands the members to increase the distance between the substrate and the electric wiring base material, the slack shape of the flying leads can absorb the increased distance. This enables the appropriate connection to be maintained between the flying leads and the substrate. A reliable printing head can thus be manufactured. Further, a slack shape can be formed on each of the flying leads by setting the step amount between the substrate and the flying lead during the step of electrically connecting the substrate and the flying lead provided on the electric wiring base material together. This eliminates the need to provide, for example, a step of newly forming a slack shape. The manufacture costs can thus be reduced.

In the printing head manufactured according to the present invention, the slack shape is formed on each flying lead. Accordingly, even if the printing head is placed in a heated environment and its parts are thermally expanded to increase the spacing between the substrate and the electric wiring base material, the slack shape formed on the flying lead can absorb the increased spacing. This enables the appropriate connection to be maintained between the flying lead and the substrate.

The above and other objects, effects, features, and advantages of the present invention will become more apparent from the following description of embodiments thereof taken in conjunction with the accompanying drawings.

DETAILED DESCRIPTION OF PREFERRED EMBODIMENTS

Now, an embodiment of the present invention will be described in detail with reference to the drawings. The embodiment will be described in conjunction with the following in the following order: 1. General Configuration of the Ink Jet Printing Apparatus, 2. General Configuration of the Print Head, 3. Configuration of Each Component of the Print Head, and 4. Characteristic Configuration of the Print head and Method for Manufacturing the Print Head.

1. General Configuration of the Ink Jet Printing Apparatus

Figure 1:
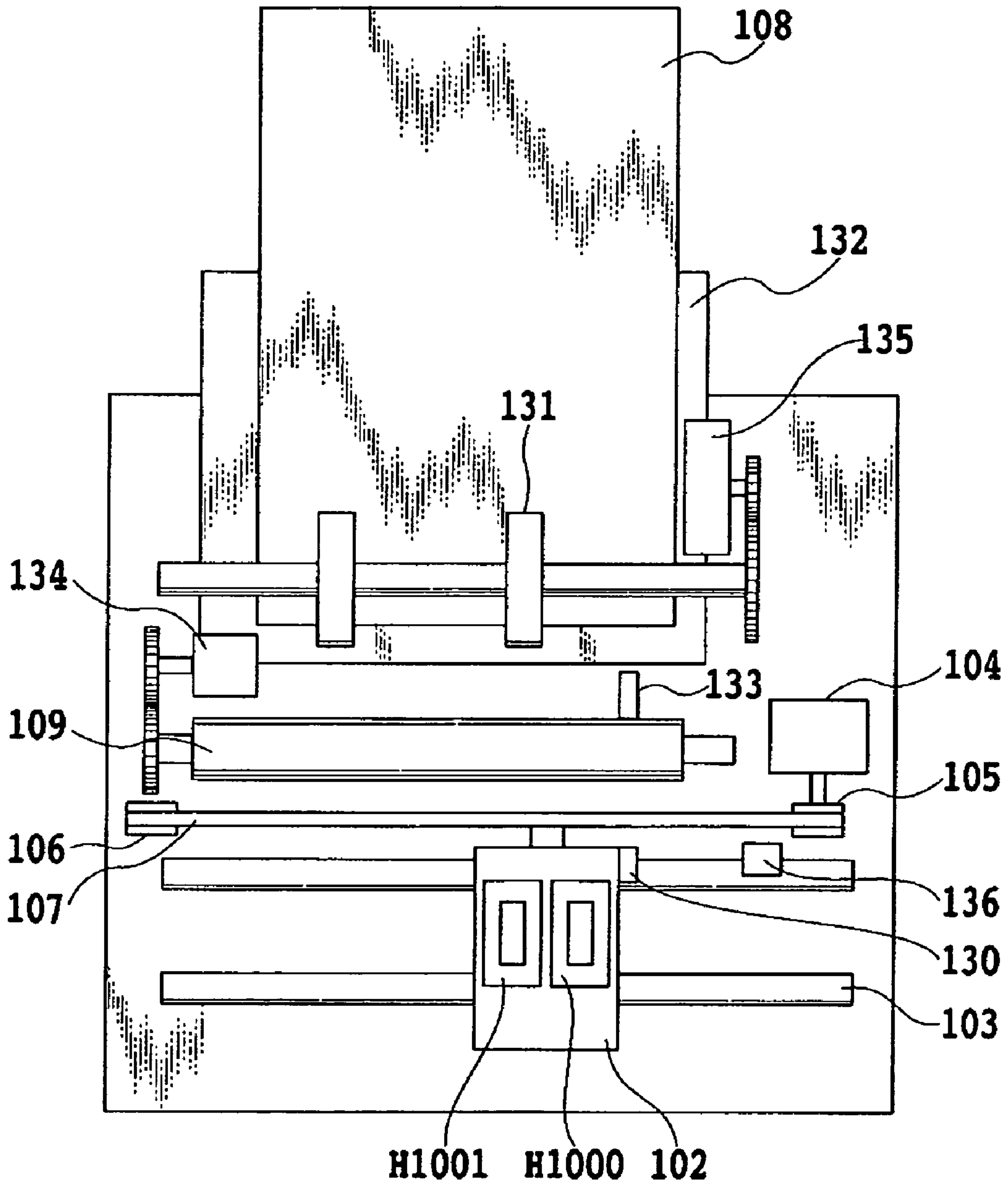
FIG. 1 is a plan view schematically showing an example of an ink jet printing apparatus to which a printing head according to an embodiment of the present invention is applied.

FIG. 1 is a schematic plan view showing an example of an ink jet printing apparatus to which the present invention is applicable. The printing apparatus has a carriage 102 on which printing heads H1000 and H1001 are positioned and replaceably mounted. The carriage 102 is provided with an electric connection portion through which a driving signal and the like are transmitted to ejecting portions via external signal connection terminals of the printing heads H1000 and H1001

The carriage 102 is supported so as to be able to reciprocate along a guide shaft 103 extending in a main scanning direction and installed in the apparatus main body.

A print medium 108 such as paper or a plastic thin sheet is fed by an auto sheet feeder (ASF) 132. The print medium 108 is further conveyed (sub-scanning) through a position (print area) opposite surfaces (ejection orifice surfaces) of the printing heads H1000 and H1001 on which ejection orifices are formed.

The printing heads H1000 and H1001 are mounted on the carriage 102 so that the ejection orifices in each ejecting portion are arranged in a direction (for example, a sub-scanning direction) crossing the main scanning direction of the carriage 102. During a main scanning process, ink is ejected from the ejection orifice arrays to execute printing over a width corresponding to the range within which the ejection orifices are arranged.

2. General Configuration of the Printing Head

The printing head of the present embodiment is inseparably integrated with ink tanks. The printing head is composed of the first printing head H1000 and the second printing head H1001. The first printing head H1000 has an ink housing portion in which black ink is filled and an ejecting portion that ejects the black ink supplied from the ink housing portion. The second printing head H1001 has ink housing potions in which plural color inks (for example, a cyan, magenta, and yellow inks) is filled and ejecting portions that eject the color inks supplied from the respective ink housing portions. The printing heads H1000 and H1001 are in cartridge form which is fixedly supported by positioning means and electric contacts and which is removable from the carriage 102. If any filled ink is consumed and exhausted, the corresponding printing head can be replaced with a new one.

Figure 2:
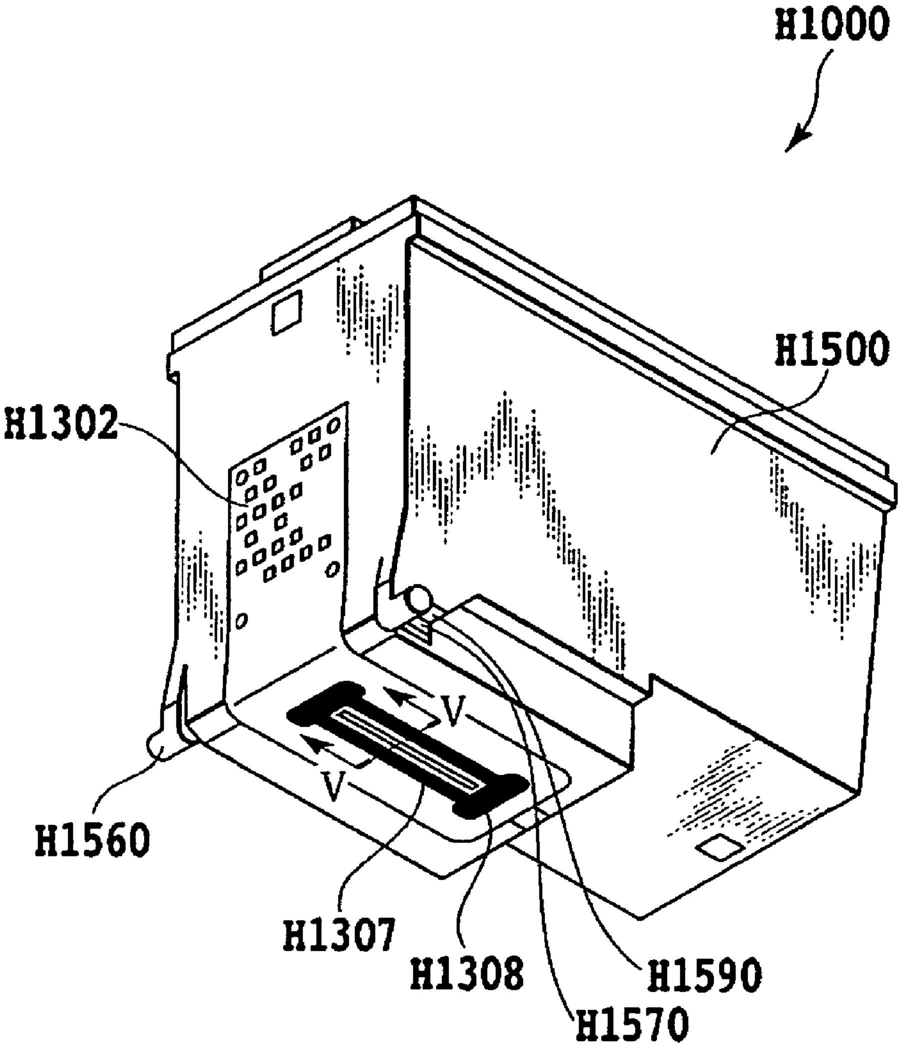
FIG. 2 is a perspective view showing an example of configuration of the printing head according to the embodiment of the present invention as viewed from a bottom surface of the printing head.
Figure 4:
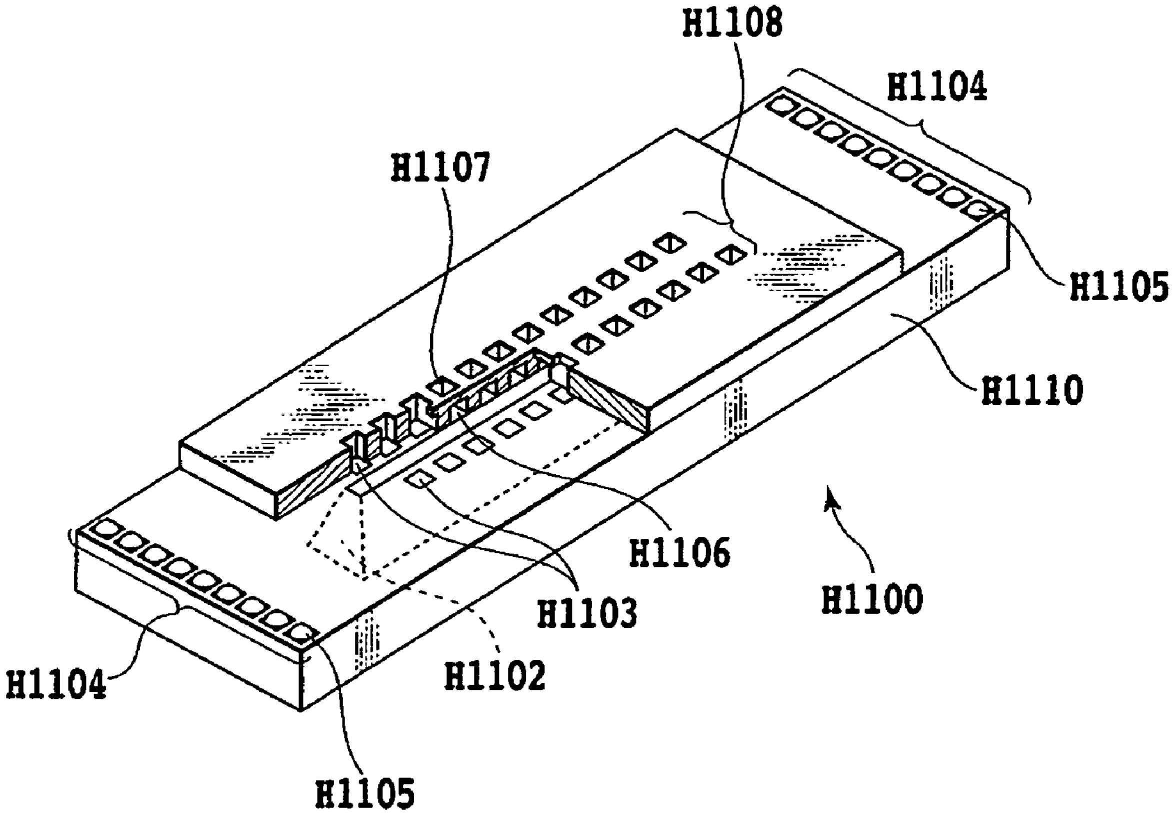
FIG. 4 is an partly cutaway perspective view showing an example of configuration of a printing element substrate provided in the printing head shown in FIG. 2.

With reference to FIGS. 2, and 4, description will be given below of basic configuration of the black ink printing head H1000, one of the printing heads H1000 and H1001 used in the embodiment. The printing head H1001 is configured similarly to the printing head H1000 except that it ejects the plural color inks, with its description omitted.

Figure 3:
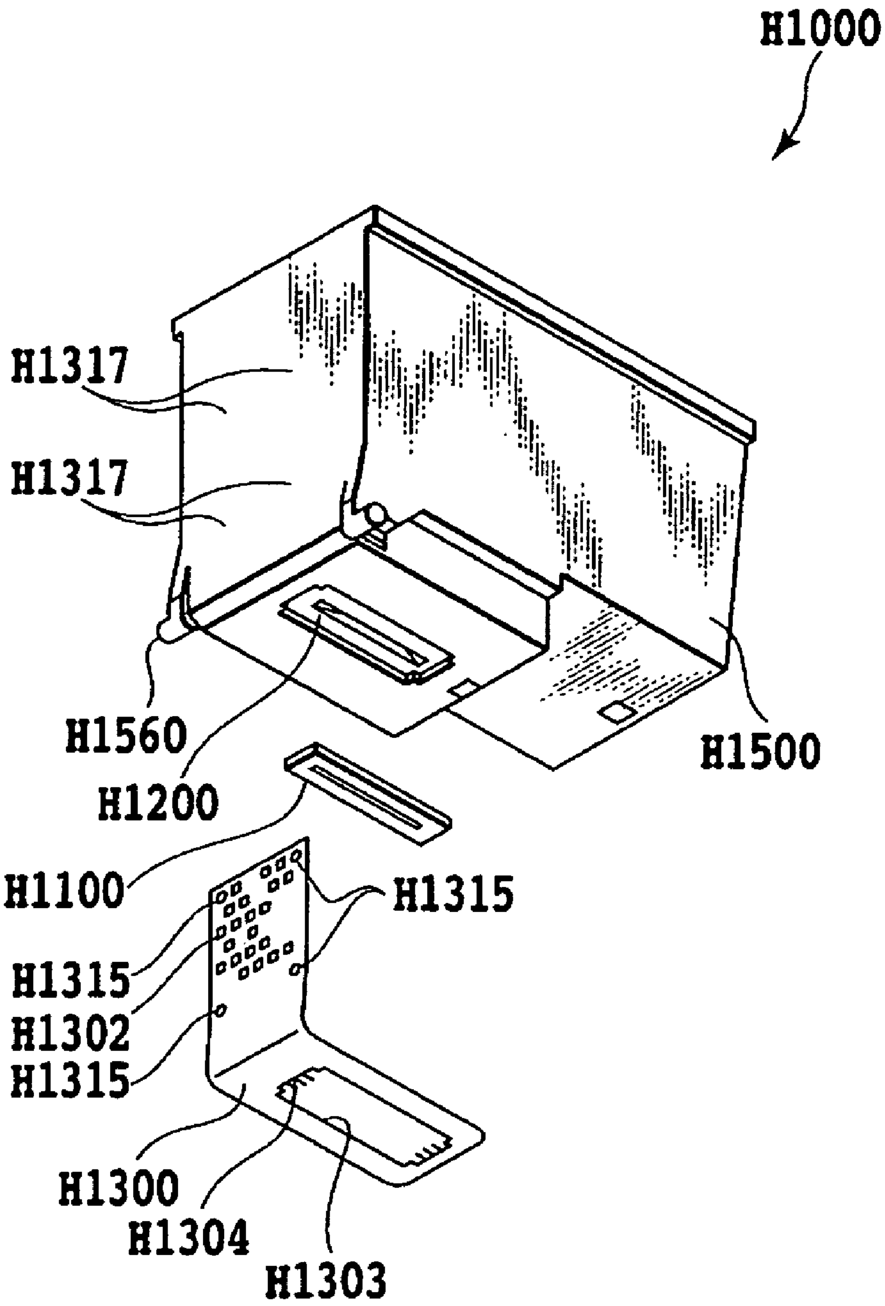
FIG. 3 is an exploded perspective view of the printing head shown in FIG. 2 and from which a printing element substrate and an electric wiring base material have been removed through the bottom of the printing head main body.

FIG. 2 is perspective views showing an example of configuration of the printing head H1000, which can be mounted in the printing apparatus in FIG. 1. FIG. 3 is an exploded perspective view of the printing head H1000.

As shown in FIGS. 2, the printing head H1000 comprises an installation guide H1560 that guides the printing head H1000 to the installation position of the carriage 102 in the ink jet printing apparatus, and an engaging portion H1930 that fixedly installs the printing head on the carriage via a fixation lever (not shown) provided on the carriage. The printing head H1000 further comprises an X direction (main scanning direction) abutting portion H1570, a Y direction (sub-scanning direction) abutting portion H1580, and a Z direction (vertical direction) abutting portion H1590 that allow the printing head to be located at a predetermined installation position on the carriage. The printing head is thus positioned on the carriage 102 by these abutting portions to enable external signal connection terminals H1302 on an electric wiring base material H1300 to electrically contact pins in an electric connection portion provided in the carriage.

3. Configuration of Each Component of the Print Head 3-1. Print Element Substrate FIG. 4 is a perspective view partly exploded in order to illustrate the configuration of the printing element substrate H1100. The printing element substrate of the present embodiment uses electrothermal conversion elements that generate, in accordance with an electric signal, thermal energy required to cause film boiling in ink. The electrothermal conversion elements are arranged opposite the ink ejection orifices to eject ink perpendicularly to the main plane of the substrate (this form is referred to as a side shooter).

As shown in FIG. 4, the printing element substrate H1100 is, for example, an Si (silicon) substrate H1110 of thickness 0.5 to 1 mm in which a slot-shaped ink supply port H1102 serving as an ink channel is formed by anisotropic etching utilizing the crystal orientation of Si or sand blasting. Two arrays of the electrothermal conversion elements H1103 are arranged across the ink supply port H1102 in the Si substrate H1110; the electrothermal conversion elements H1103 generate, in accordance with an electric signal, thermal energy required to cause film boiling in ink. The electrothermal conversion elements in one of the arrays are arranged offset from the corresponding electrothermal conversion elements in the other away by half an arrangement pitch in the arrangement direction, that is, in the sub-scanning direction. An ejection orifice forming member is adhered to the printing element substrate H1100 with the electrothermal conversion elements aligned with the corresponding ejection orifices; the ejection orifice forming member consists of a resin material and has an ink channel wall H1106 and ejection orifices H1107 formed by a photolithography technique. This constitutes an ejecting portion H1108.

Electric wiring, a fuse, a logic circuit, and an electrode portion H1104 are formed on the Si substrate H1110; the electric wiring consists of Al to supply power to the electrothermal conversion elements H1103, the logic circuit that drives the electrothermal conversion elements in accordance with print data, and the electrode portion H1104 electrically connects these components to external devices. Bumps H1105 made of Au or the like are formed on the electrode portion H1104. The electrothermal conversion elements H1103 and the like can be formed utilizing an existing film forming technique.

With the substrate H1100, having the energy generating elements, ink supplied through the ink channel H1102 is ejected from the ejection orifices 1107 corresponding to the electrothermal conversion elements H1103 under the pressure of bubbles generated by heat from the electrothermal conversion elements H1103.

The elements that generate energy utilized to eject ink are not limited to the electrothermal conversion elements that generate, in response to energization, thermal energy required to heat and bubble ink. Ink may be ejected parallel to the main plane of the substrate on which the electrothermal conversion elements are arranged (this form is referred to as an edge shooter).

3-2. Electric Wiring Base Material

The electric wiring base material H1300 forms an electric signal path through which an electric signal that causes ink to be ejected is applied to the printing element substrate H1100. The electric wiring base material H1300 is constructed by forming a wiring pattern of a copper foil on a polyimide base material. An opening is formed in the electric wiring base material H1300 so that the printing element substrate H1100 can be incorporated into the opening. Flying leads H1304 are formed near an edge of the opening and connected to the electrode portion H1104 of the printing element substrate H1100. External signal connection terminals H1302 are formed on the electric wiring base material H1300 to receive an electric signal from the main body apparatus. The external signal connection terminals H1302 are connected, via the flying leads H1304, to the conductive wiring pattern of a copper foil or the like formed on the electric wiring base material H1300.

The electric connection between the electric wiring base material H1300 and the printing element substrate H1100 is made by, for example, connecting the bumps H1105, formed on the electrode portion H1104 of the printing element substrate H1100, to the flying leads H1304 of the electric wiring base material H1300, corresponding to the electrode portion H1104 of the printing element substrate H1100 according to a connection method according to the present invention, described later.

3-3. Print Head Main Body

Resin is molded to form the printing element substrate H1100, which constitutes the ejecting portion, and the printing head main body H1500, serving as a supporting member that supports the electric wiring base material H1300. Desirably, 5 to 40% of glass filler is mixed into the resin material in order to improve form rigidity. However, the glass filler is characterized to change, when contained in the resin, the coefficient of linear expansion of the resin depending on the orientation of the filler.

An ink supply port H1200 is formed downstream of the ink channel in order to supply black ink to the printing element substrate H1100. The printing element substrate H1100 is positionally accurately bonded and fixed to an ink supply holding member H1500 so that the ink supply port 1102 is in communication with each ink supply port H1200 in the ink supply holding member H1500.

Figure 5:
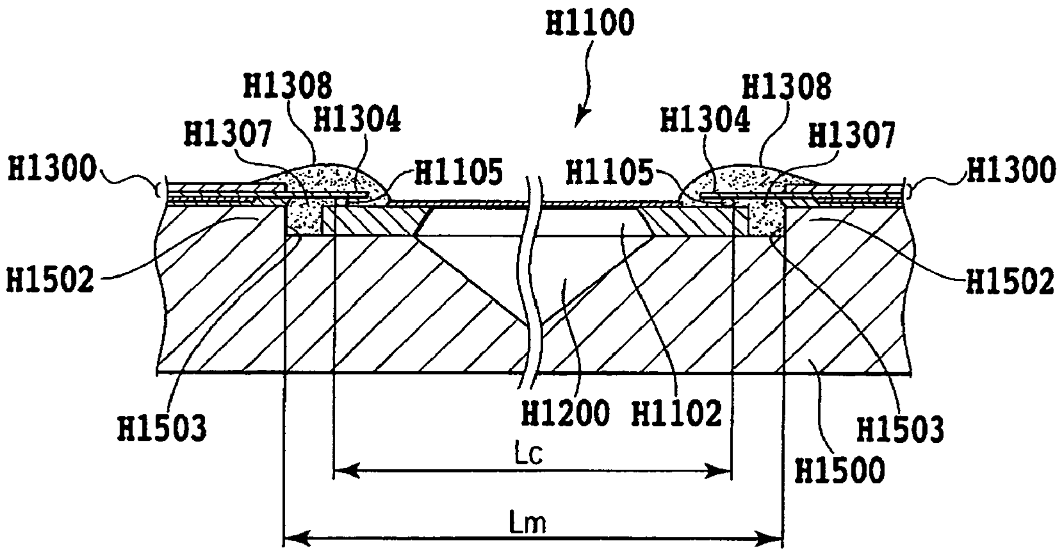
FIG. 5 is an enlarged sectional view of the printing head shown in FIG. 4, the view being taken along line V-V of FIG. 2.

FIG. 5 is an enlarged sectional view showing the printing head H1000, shown in FIG. 4, the view being taken along line V-V of FIG. 2, The printing element substrate H1100 and electric wiring base material H1300 are mounted on the printing head main body H1500.

As shown in FIG. 5, a part of the electric wiring base material H1300 is fixedly bonded, with a second adhesive H1308, to a plane formed around the periphery of the ink supply port H1200. The electric connection portion between the printing element substrate H1100 and the electric wiring base material H1300 is sealed with a first sealing compound 1307 and the second sealing compound 1308. This protects the electric connection portion from corrosion by ink and external impacts. The first sealing compound H1308 seals the back surface of the connection portion between the flying leads H1304 of the electric wiring base material H1300 and the bumps H1105 of the printing element substrate H1100 as well as the outer periphery of the printing element substrate. The second sealing compound H1308 seals the front of the connection portion.

The non-adhered area of the electric wiring base material H1300, that is, the area in which the external signal connection terminals H1302 are arranged, is folded along a side of the main body which is almost orthogonal to a surface of the printing head main body H1500 which includes the ink supply port H1200. Pins H1317 projecting from sides of the main body are then inserted through holes H1315 formed in several positions around the area, for example, the four corners of the area. Heat caulking or bonding is then carried out to fix the pins H1317.

4. Characteristic Configuration of the Print Head and Method for Manufacturing the Print Head With reference to the drawings, a detailed description will be given of the characteristic structure of the printing head according to the present invention and embodiment of a method for manufacturing the printing head.

Figure 6A:
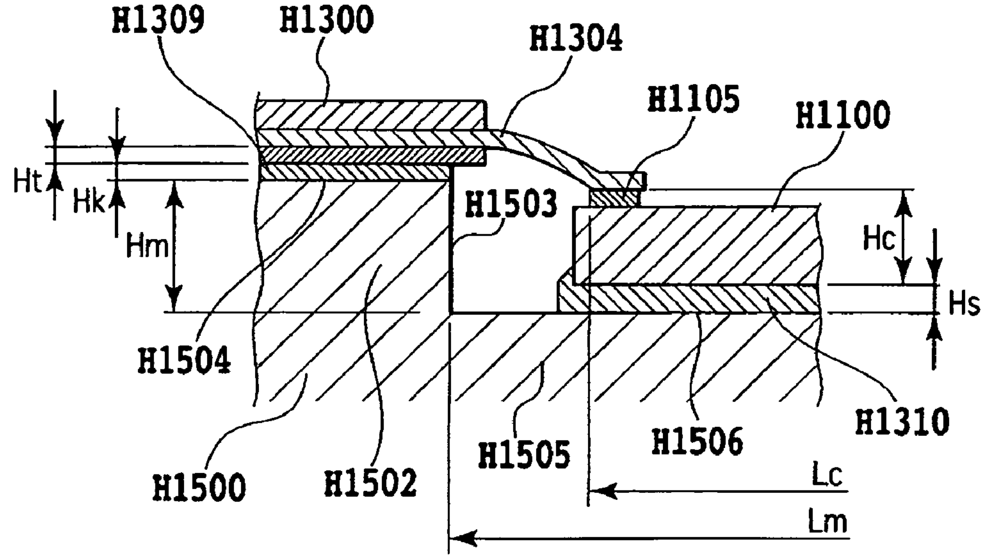
FIG. 6A is sectional view schematically showing that a unit including a printing element substrate and a printing element base material connected together is mounted in the printing head main body according to the embodiment of the present invention.

FIG. 6A is an enlarged sectional view schematically showing that the printing element substrate H1100 and electric wiring base material H1300 are mounted on the printing head main body H1500.

As also described above for the basic configuration, the printing head H1000 according to the present embodiment is provided with the printing head main body H1500, the printing element substrate H1100, having the energy generating elements, and the electric wiring base material H1300, comprising the flying leads H1304 connected to the electric connection terminal portions H1105 provided on the opposite sides of the printing element substrate H1100. FIG. 6A shows how one lead of the electric wiring base material H1300 is connected to a corresponding one of the electric connection terminals H1105 formed at the respective end of the printing element substrate H1100. That is to say, FIG.6A is an enlarged view of the region left of a broken line in FIG. 5.

In FIG. 6A, reference numeral H1309 denotes an adhesive that fixes the electric wiring base material H1304 to the main body H1500. Reference numeral H1310 denotes an adhesive that fixes the printing element substrate to the printing head main body H1500.

Figure 6B:
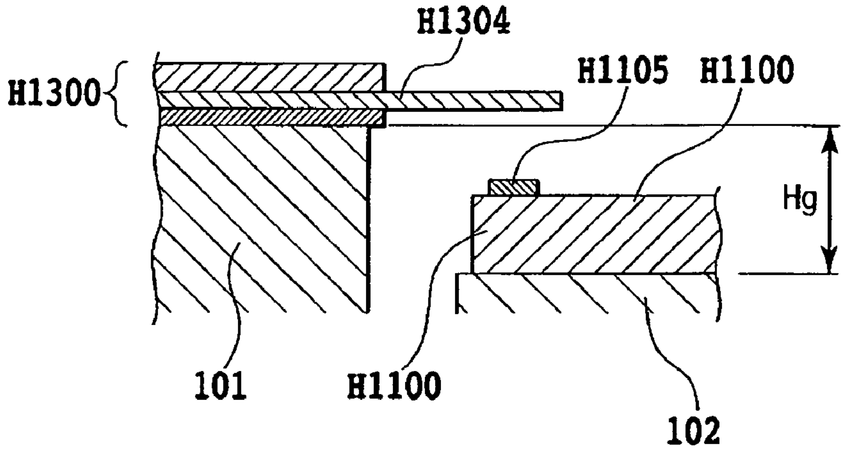
FIG. 6B is a sectional view schematically showing receiving jigs used to connect the printing element substrate and an electric wiring base material together.

FIG. 6B is a diagram showing a jig used to connect the printing element substrate H1100 and the electric wiring base material H1300 together. In the figure, reference numeral 101 denotes a receiving jig that holds the electric wiring base material H1300. Reference numeral 102 denotes a receiving jig that holds the printing element substrate H1100. At least one of the receiving jigs 101 and 102 can be moved in vertical and horizontal directions by an elevating and lowering mechanism (not shown). This enables adjustment of a step Hg between the bottom surface of the element wiring base material H1300 held by the receiving jig 101 and the bottom surface of the printing element substrate H1100 held by the receiving jig 102. It is possible to adjust the relative positions of the held electric wiring base material H1300 and printing element substrate H1100 in the horizontal direction.

Now, with reference to the schematic diagram in FIGS. 7A to 7E, description will be given of a process of fixing the printing head H1000 according to the present embodiment and the printing element substrate H1100 to the printing head main body H1500.

Figure 7A:
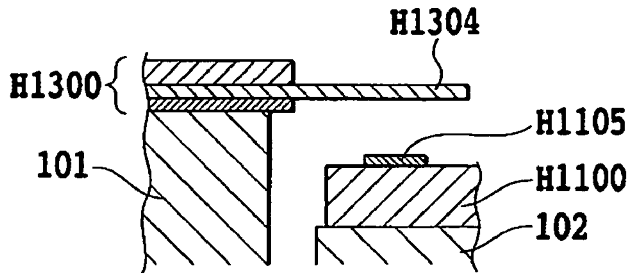
FIGS. 7A to 7E are enlarged sectional views schematically showing a process of fixing the printing element substrate and electric wiring base material to the printing head main body.

In this process, as shown in FIG. 7A, the electric wiring base material H1300 having the flying leads H1304 is fixed to the receiving jig 101. The printing element substrate H1100 having the electric connection terminal H1105 is fixed to the receiving jig 102. At this time, a top surface of the receiving jig 101 is set above a top surface of the receiving jig 102. The resulting step amount Hg (see FIG. 6B) has a value (0.85 mm) set on the basis of a value meeting a relation described later.

In this stage, as shown in FIG. 7A, each flying lead H1304 projects to the space above the corresponding connection terminal H1105. In this condition, the electric connection terminal H1105 is aligned with the flying lead H1304. Consequently, in this aligning step, the flying lead H1304 and the electric connection terminal H1105 do not contact each other. This makes it possible to prevent the flying lead H1304 from being loaded, thus enabling proper alignment.

Figure 7B:
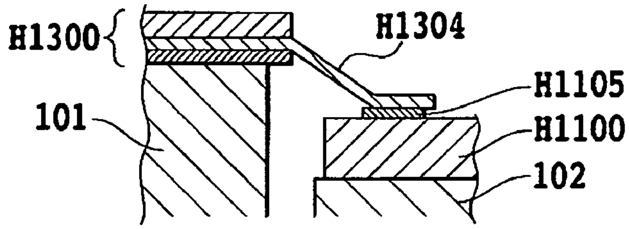

Then, as shown in FIG. 7B, the flying lead H1304 of the electric wiring base material H1300 is electrically connected to the electric connection terminal H1105. The present embodiment uses a gang bonding manner to make this electric connection. However, the bonding manner is not limited to the gang bonding manner but may be a single point bonding manner. The flying lead H1304 connected during this step is substantially straight from its base end to its part contacting the electric connection terminal H1105

Figure 7C:
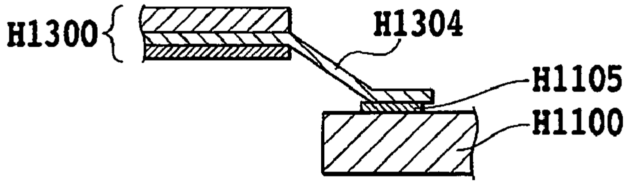

Then, as shown in FIG. 7C, the printing element substrate H1100 and the electric wiring base material H1300 are removed from the jigs 101 and 102, respectively; the electric wiring base material H1300 has the flying leads H1304 electrically connected to the printing element substrate H1100. The printing element substrate H1100 and electric wiring base material H1300 are then arranged on the printing head main body H1500. The step amount between a top surface H1504 of step portion H1502 of the printing head main body H1500 and a top surface H1506 of a lower portion H1505 is set smaller than that between a top surface of the jig 101 and a top surface of the jig 102.

Figure 7D:
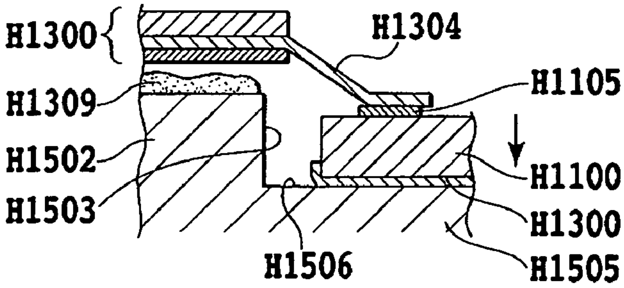

As shown in FIG. 7D, the printing element substrate H1100 is fixedly bonded, via an adhesive H1310, to the top surface H1506 of the lower portion H1505, formed in the printing head main body H1500. An adhesive H1309 is applied to the top surface of the step portion 1502 of the printing head main body H1500.

Figure 7E:
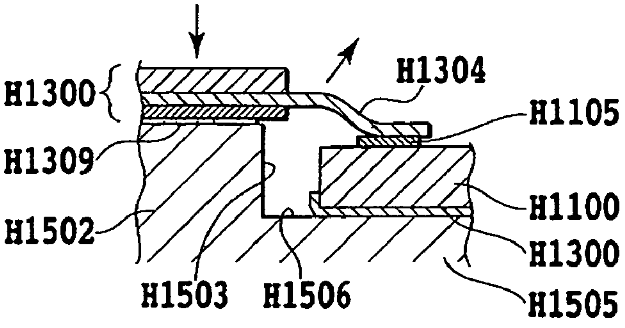

Subsequently, as shown in FIG. 7E, the electric wiring base material H1300 is lowered and fixedly bonded to the top surface of the printing head main body H1500 via the adhesive H1309. As previously described, the step amount between the top surface H1504 of step portion H1502 of the printing head main body H1500 and the top surface H1506 of the lower portion H1505 is set smaller than that between the top surface of the jig 101 and the top surface of the jig 102. Thus, while the printing element substrate H1100 and the electric wiring base material H1300 are fixedly bonded to the printing head main body H1500, the flying leads H1304 are gently bent as shown in FIG. 7E.

Figure 8A:
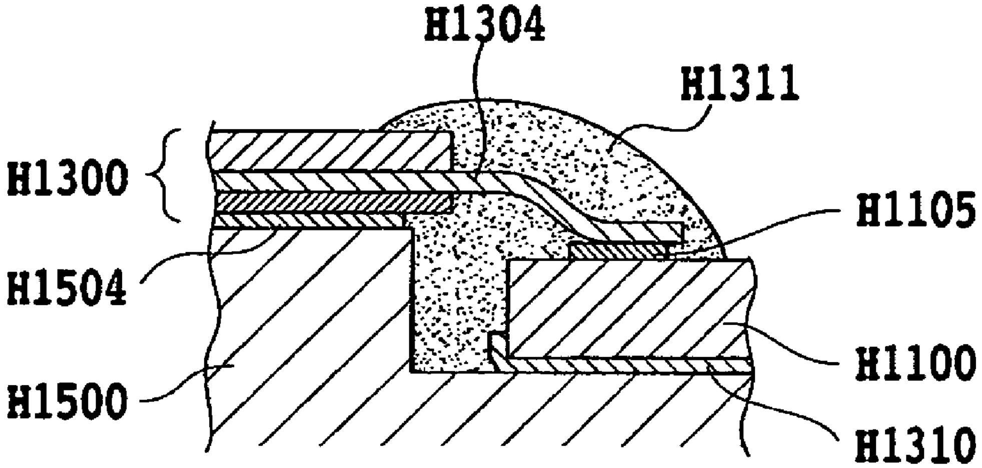
FIG. 8A is an enlarged sectional view schematically showing that after the process shown in FIGS. 7A to 7E, a sealing compound is applied to the connection portion between the printing element substrate and electric wiring base material.

The unit including the printing element substrate H1100 and electric wiring base material H1300 connected together is fixed to the printing head main body H1500. Then, as shown in FIG. 8A, a heat-hardening sealing compound 1311 is applied to the periphery of the electric connection portion between each flying lead H1304 and the corresponding electric connection terminal H1105.

Figure 8B:
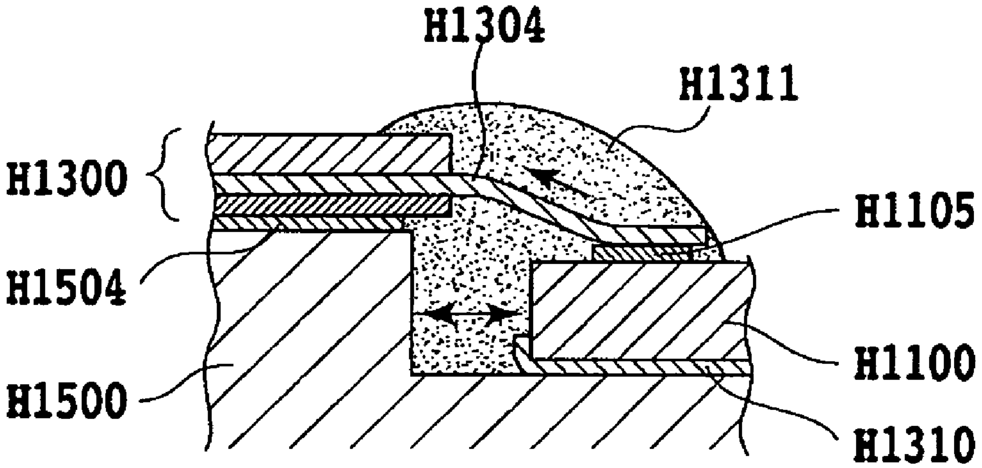
FIG. 8B is an enlarged sectional view showing that heat curing is executed on the printing head shown in FIG. 8A.

After the sealing step, heat curing is executed to harden the applied heat-hardening protect sealing compound H1311 as shown in FIG. 8B. This reinforces the electric connection portion to protect it from short-circuiting or corrosion resulting from attachment of a liquid such as ink.

The heat curing thermally expands the printing head main body H1500. Since the electric wiring base material H1300 and the printing element substrate H1100 are fixedly bonded to the printing head main body H1500, the electric wiring base material H1300 is pulled away from the electric connection terminals H1105 of the printing element substrate H1100. This increases the distance from the base end of each flying lead H1304 to the corresponding electric connection terminal H1105. However, a slack amount appropriate to deal with the heat curing is preset for the flying leads H1304. Thus, even if an increase in distance is caused by the heat curing, the increase in distance is absorbed by a part of the slack amount of the flying leads H1304. Consequently, even after the heat-hardening sealing compound H1311 is hardened, the flying leads do not go completely slack. As shown in FIG. 8B, a gently bent slack shape is maintained. The continuously gently bent shape of the flying leads H1304 prevents a possible local marked stress. The present embodiment thus prevents cracks or ruptures caused by thermal expansion of the flying leads H1304, resulting in improved reliability.

Figure 9A:
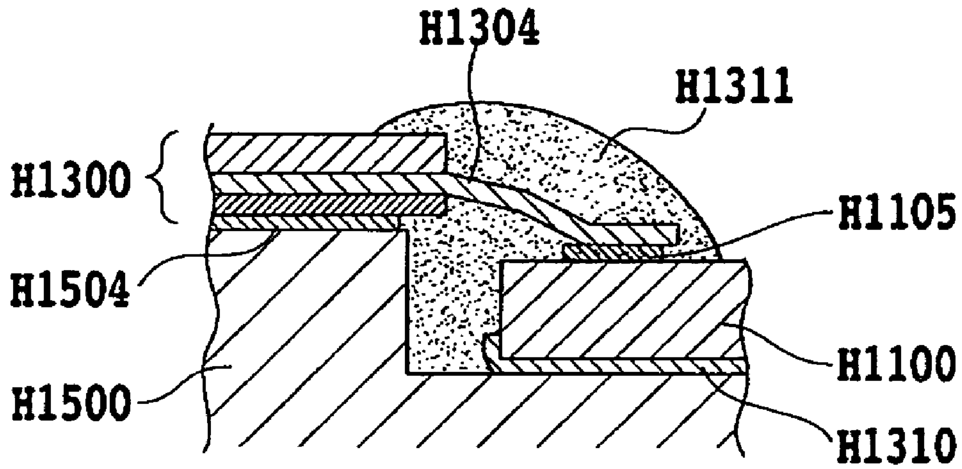
FIG. 9A is an enlarged sectional view schematically showing that the unit including the printing element substrate and electric wiring base material connected together is mounted on the printing head main body according to a comparative example of the embodiment of the present invention, which has not been subjected to heat curing yet.
Figure 9B:
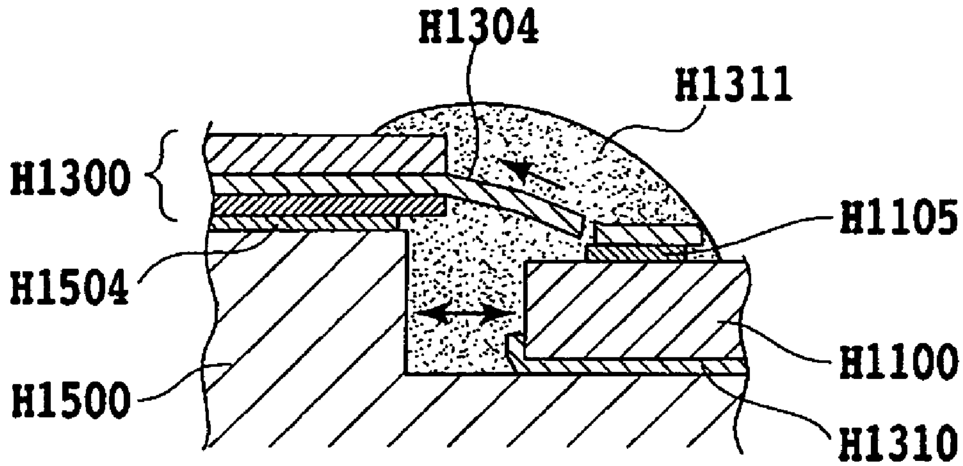
FIG. 9B is an enlarged sectional view schematically showing that the unit including the printing element substrate and electric wiring base material connected together is mounted on the printing head main body according to the comparative example of the embodiment of the present invention, which has already been subjected to heat curing.

In contrast, if the flying lead H1304 is not slack or is insufficiently slack after the heat-hardening sealing compound H1311 has been applied as shown in FIG. 9A, thermal expansion resulting from heat curing applies an excessive tension to the flying lead H1304. This may rupture or crack the flying lead H1304 as shown in FIG. 9B, thus significantly degrading reliability. Moreover, the sealing compound H1311 is hardened with the flying lead H1304 inappropriately electrically connected as described above. This requires an inspection step of checking the connection state, thus complicating the manufacture process to increase manufacture costs.

The present embodiment can avoid this situation. Specifically, the present embodiment can greatly improve the reliability of the printing head while simplifying the manufacture process to reduce the manufacture costs.

Now, description will be given of a method for setting the step amount Hg required to slack the flying leads during the above step.

First, description will be given of dimensions of the components shown in FIGS. 6A and 6B.

Reference character Lc denotes the distance (see FIG. 5) between the ends of connection portions of the right and left flying leads H1304 connected to the respective electric connection terminals H1105 (FIG. 5 shows only one of them), provided at the respective ends of the printing element substrate H1100. Reference character Lm denotes the distance (see FIG. 5) between one side end surface 1503 and the other side end surface 1503 of the step portion H1502 of the printing head main body H1500.

Reference character Hc denotes a thickness (bonding height) from the back surface of the printing element substrate H1100 to the electric connection terminal H1105. Reference character Hs denotes the thickness of the adhesive H1310, used to laminate the printing element substrate H1100 to the printing head main body H1500. Reference character Hm denotes the step amount between the top surface H1504 of step portion H1502 of the printing head main body H1500 and the top surface H1506 of the lower portion H1505. Reference character Hk denotes the thickness of the adhesive H1310, used to laminate the electric wiring base material H1300. Reference character Ht denotes the thickness of wiring protect film of the electric wiring base material H1300. Reference character Hg denotes the step amount between the top surface of the receiving jig 101 and the top surface of the receiving jig 102.

The present embodiment uses the above set values to set the step amount Hg between the jigs 101 and 102 on the basis of the following relation:

$$H_g \geq \sqrt{\left(\frac{L_m\beta_m - L_c\beta_c}{2}\right)^2 + \left[\begin{array}{c} H_m\beta_m + \\ H_k + H_t\beta_t - \\ (H_c\beta_c + H_s) \end{array}\right]^2 - \left(\frac{L_m - L_c}{2}\right)^2} - H_t$$

where $\alpha_m$: coefficient of linear expansion of an ink supply member or ink supply supplementing member, $\alpha_c$: coefficient of linear expansion of a substrate having energy generating elements, $\alpha_t$: coefficient of linear expansion of a TAB having flying leads, $\beta_m = \alpha_m \Delta T + 1$, $\beta_c = \alpha_c \Delta T + 1$, $\beta_t = \alpha_t \Delta T + 1$, and ΔT: difference between the maximum process temperature and room temperature.

The following table shows an example of parameter values set according to the present embodiment.

| | |
|---|---|
| Lm | 20.000 |
| Hm | 0.750 |
| Lc | 18.500 |
| Hc | 0.650 |
| Hs | 0.050 |
| Hk | 0.010 |
| Ht | 0.050 |
| αm | 0.000030 |
| αc | 0.000003 |
| αt | 0.000016 |
| ⊿T | 100 |

The parameters were set as shown above and their values were calculated on the basis of the above relation. Then, the step amount Hg between the jigs 101 and 102 was at least 0.79 mm. The step amount Hg was set at 0.85 mm on the basis of the above calculation, the thickness of the printing element substrate H1100, the tolerance of the electric wiring base material H1300, and the like.

The above manufacture method was carried out on the basis of this Hg. Then, even with a heat curing step with ΔT=100° C., the flying leads H1300 and their electric connection portions were not affected. Appropriate connections were confirmed.

4. Other Embodiments

In the description of the above embodiment, by way of example, the heat-hardening sealing compound is applied to the periphery of electric connection portion between each flying lead and the corresponding electric connection terminal. However, the present invention is not limited to this sealing compound. A sealing compound that can be hardened at room temperature is also available. This eliminates the heat curing step of hardening the sealing compound. Accordingly, ΔT in the above relation may be set depending on the other heating environments.

In the description of the above example, the present invention is applied to the configuration of the printing head H1101 that ejects black ink. However, the present invention can provide a similar configuration for a cyan, magenta, and yellow printing heads H1001. The types and number of tones (colors and concentrations) of ink used in the printing head may of course be set appropriately.

In the above description, the present invention is applied to the printing head inseparably integrated with the ink housing portion. However, the present invention does not exclude the form of a printing head separably integrated with ink tanks.

The present invention has been described in detail with respect to preferred embodiments, and it will now be apparent from the foregoing to those skilled in the art that changes and modifications may be made without departing from the invention in its broader aspects, and it is the intention, therefore, that the appended claims cover all such changes and modifications as fall within the true spirit of the invention.

This application claims priority from Japanese Patent Application No. 2005-200149 filed Jul. 8, 2005, which is hereby incorporated by reference herein.

What is claimed is:

1. A method for manufacturing a printing head, the method comprising:

a connecting step of connecting deformable flying leads provided on an electric wiring base material supported by a second supporting surface of a second supporting member to electric connection terminals provided on a substrate having ejection energy generating elements that receive electric energy to generate ejection energy required to eject ink, the substrate being supported by a first supporting surface of a first supporting member; and a mounting step of mounting a unit, comprising the electric wiring base material and the substrate connected together during the connecting step, on first and second surfaces formed on a main body of the printing head at different heights, after the unit is removed from the first and second supporting members, wherein the connecting step positions the first and second supporting members such that a step amount which is equal to a difference in height between the first supporting surface of the first supporting member and the second supporting surface of the second supporting member is larger than a step amount which is equal to a difference in height between the first and second surfaces of the printing head main body, and connects the flying leads to the electric connection terminals, to form a slack shape bent along a continuous curved surface of each of the flying leads, to enable coupling of the electric wiring base material mounted on the first surface during the mounting step to the electric connection terminals of the substrate mounted on the second surface during the mounting step, wherein the connecting step adjusts the height of at least one of the second supporting member that supports the electric wiring base material and the first supporting member that supports the substrate, causes the first and second supporting members to hold the substrate and the electric wiring base material, respectively, to set the step amount between the electric wiring base material and the substrate, and then connects the flying leads of the electric wiring base material to the electric connection terminals of the substrate, and wherein when Lc denotes a distance between opposite ends of the electric connection terminals provided at respective ends of the substrate, Lm denotes a spacing, in a planar direction, between respective sides of the second surface of the printing head main body, Hc denotes a thickness from a back surface of the substrate to the electric connection terminal, Hs denotes the thickness of an adhesive that is bonded to an ink supply member or an ink supply supplementing member, Hm denotes a step amount between the first and second surfaces, Hk denotes the thickness of an adhesive used to bond the electric wiring base material, Ht denotes the thickness of a wiring protect member provided on a bottom surface of the electric wiring base material, Hg denotes a step amount between the first and second supporting members, αm denotes a coefficient of linear expansion of the printing head main body, αc denotes a coefficient of linear expansion of the substrate, αt denotes a coefficient of linear expansion of the electric wiring base material, and ΔT denotes a difference between a maximum ultimate temperature which is experienced during manufacture and room temperature, at least values set to meet the following expression are set:

$$H_g \geq \sqrt{\left(\frac{L_m\beta_m - L_c\beta_c}{2}\right)^2 + \begin{bmatrix} H_m\beta_m + \\ H_k + H_t\beta_t - \\ (H_c\beta_c + H_s) \end{bmatrix}^2 - \left(\frac{L_m - L_c}{2}\right)^2} - H_t$$

where $$\beta_m = \alpha_m \Delta T + 1,$$

$$\beta_c = \alpha_c \Delta T + 1, \text{ and}$$

$$\beta_t = \alpha_t \Delta T + 1.$$

* * * * *